US012700576B2

(12) United States Patent
Yamamura et al.

(10) Patent No.: US 12,700,576 B2
(45) Date of Patent: Aug. 4, 2026

(54) PLASMA PROCESSING APPARATUS AND PLASMA PROCESSING METHOD

(71) Applicant: Tokyo Electron Limited, Tokyo (JP)

(72) Inventors: Takashi Yamamura, Hsin-chu City (TW); Chunhsiang Yang, Hsin-chu City (TW); Yasutaka Hama, Hsin-chu City (TW)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 18/605,369

(22) Filed: Mar. 14, 2024

(65) Prior Publication Data

US 2024/0222095 A1 Jul. 4, 2024

Related U.S. Application Data

(63) Continuation of application No. PCT/JP2022/034085, filed on Sep. 12, 2022.

(30) Foreign Application Priority Data

Sep. 14, 2021 (JP) ................................. 2021-149137

(51) Int. Cl.
*H01J 37/32* (2006.01)

(52) U.S. Cl.
CPC .. *H01J 37/32733* (2013.01); *H01J 37/32174* (2013.01); *H01J 37/32449* (2013.01);
(Continued)

(58) Field of Classification Search
CPC ........... H01J 37/32733; H01J 37/32174; H01J 37/32449; H01J 37/32697; H01J 37/32715; H01J 37/32816; H01J 2237/3341
See application file for complete search history.

(56) References Cited

U.S. PATENT DOCUMENTS

| | | | | |
|---|---|---|---|---|
| 11,501,995 | B2 * | 11/2022 | Uchida | ............. H01J 37/32642 |
| 2003/0000647 | A1 * | 1/2003 | Yudovsky | ........... H10P 72/7612 |
| | | | | 118/728 |

(Continued)

FOREIGN PATENT DOCUMENTS

| | | | |
|---|---|---|---|
| CN | 222320176 U | * | 1/2025 |
| KR | 10-2015-0131895 A | | 11/2015 |

(Continued)

OTHER PUBLICATIONS

International Search Report and Written Opinion mailed on Oct. 25, 2022, received for PCT Application PCT/JP2022/034085, filed on Sep. 12, 2022, 9 pages including English Translation.

*Primary Examiner* — Adam D Houston
(74) *Attorney, Agent, or Firm* — XSENSUS LLP

(57) ABSTRACT

A plasma processing apparatus for performing plasma processing on a substrate, includes: a chamber; a substrate support provided inside the chamber, including a region where the substrate is supported and an edge ring provided around the region, and configured to support the substrate inside the edge ring; a plasma generator provided inside the chamber to generate plasma; a lifter provided inside the chamber to control a distance between the substrate support and the substrate; and a controller, wherein the controller controls: the lifter to position the substrate at a first position spaced apart by a first distance from the substrate support; the plasma generator to generate plasma inside the chamber while the substrate is at the first position; and the lifter to place the substrate on the substrate support inward of the edge ring from the first position while the plasma is generated inside the chamber.

9 Claims, 9 Drawing Sheets

(52) U.S. Cl.
CPC .. *H01J 37/32697* (2013.01); *H01J 37/32715*
(2013.01); *H01J 37/32816* (2013.01); *H01J*
*2237/3341* (2013.01)

(56) References Cited

U.S. PATENT DOCUMENTS

| | | | | |
|---|---|---|---|---|
| 2021/0280441 | A1* | 9/2021 | Amikura | H10P 72/0441 |
| 2022/0013339 | A1* | 1/2022 | Dogome | H01J 37/32642 |
| 2023/0335381 | A1* | 10/2023 | Yoo | H01J 37/32642 |
| 2023/0386798 | A1* | 11/2023 | Bin Budiman | H01J 37/32642 |
| 2024/0222095 | A1* | 7/2024 | Yamamura | H01J 37/32697 |
| 2024/0339306 | A1* | 10/2024 | Sawachi | H01J 37/32733 |
| 2024/0355667 | A1* | 10/2024 | Yan | H10P 72/7612 |
| 2025/0079138 | A1* | 3/2025 | Aramaki | H01J 37/32697 |
| 2025/0112031 | A1* | 4/2025 | Aramaki | H01J 37/32642 |
| 2025/0201535 | A1* | 6/2025 | Oikawa | H01J 37/32174 |
| 2025/0210330 | A1* | 6/2025 | Matsumoto | H01J 37/32807 |
| 2025/0226189 | A1* | 7/2025 | Akama | H01J 37/32697 |

FOREIGN PATENT DOCUMENTS

| | | | | |
|---|---|---|---|---|
| KR | 10-2020-0110199 A | | 9/2020 | |
| KR | 20250071933 A | * | 5/2025 | H10P 72/7612 |
| WO | 00/25347 A1 | | 5/2000 | |

* cited by examiner

FIG. 1

1: Plasma processing apparatus

———10

———11

———12

2: Controller

———2a

2a1     2a2     2a3

Distance (mm)

PLASMA PROCESSING APPARATUS AND PLASMA PROCESSING METHOD

CROSS-REFERENCE TO RELATED APPLICATIONS

This application is a bypass continuation application of international application No. PCT/JP2022/034085 having an international filing date of Sep. 12, 2022, and designating the United States, the international application being based upon and claiming the benefit of priority from Japanese Patent Application No. 2021-149137, filed on Sep. 14, 2021, the entire contents of each are incorporated herein by reference.

TECHNICAL FIELD

An exemplary embodiment of the disclosure relates to a plasma processing apparatus and a plasma processing method.

BACKGROUND

As a technique for capturing particles generated inside a plasma chamber, there is a plasma processing apparatus disclosed in Patent Document 1.

PRIOR ART DOCUMENTS

Patent Documents

Patent Document 1: International Publication No. WO 2000/025347

SUMMARY

According to an embodiment of the present disclosure, a plasma processing apparatus for performing plasma processing on a substrate, includes: a chamber; a substrate support provided inside the chamber and including a region in which the substrate is supported and an edge ring provided around the region, the substrate support being configured to support the substrate inside the edge ring; a plasma generator provided inside the chamber and configured to generate plasma; a lifter provided inside the chamber and configured to control a distance between the substrate support and the substrate; and a controller, wherein the controller is configured to execute a control to cause: the lifter to position the substrate at a first position spaced apart by a first distance from the substrate support; the plasma generator to generate the plasma inside the chamber in a state in which the substrate is at the first position; and the lifter to place the substrate on the substrate support inward of the edge ring from the first position in a state in which the plasma is generated inside the chamber.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 1 is a view for explaining a configuration example of a plasma processing system.

DETAILED DESCRIPTION

Figure 2:
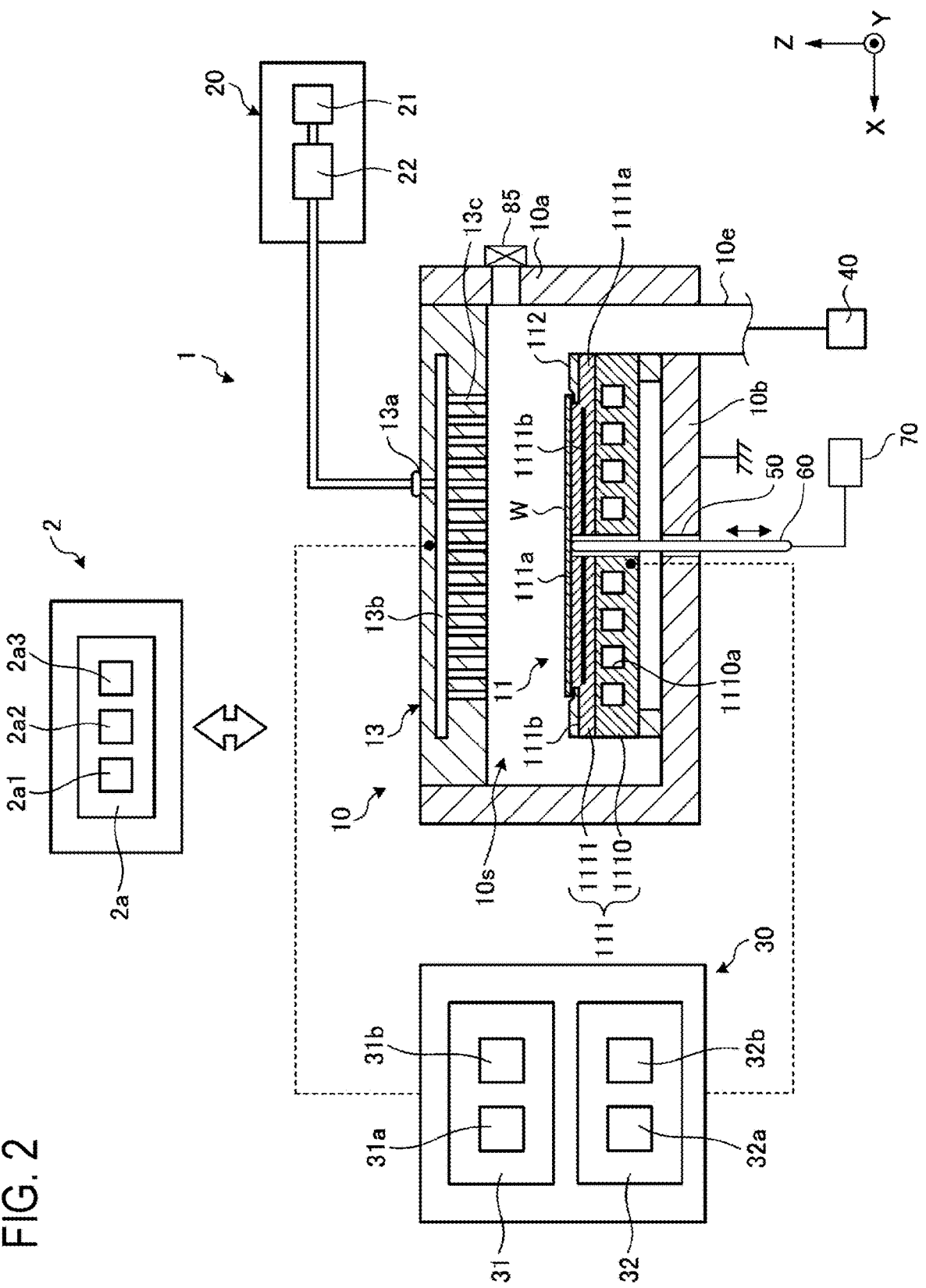
FIG. 2 is a view for explaining a configuration example of a capacitively coupled plasma processing apparatus.

Hereinafter, each embodiment of the present disclosure will be described. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

An exemplary embodiment provides a plasma processing apparatus. The plasma processing apparatus, which performs plasma processing on a substrate, includes: a chamber; a substrate support provided inside the chamber, including a region in which the substrate is supported and an edge ring provided around the region, and configured to support the substrate inward of the edge ring; a plasma generator configured to generate plasma inside the chamber; and a lifter configured to control a distance between the substrate support and the substrate inside the chamber; and a controller. The controller is configured to execute a control to cause: the lifter to position the substrate at a first position spaced apart by a first distance from the substrate support; the plasma generator to generate the plasma inside the chamber in a state in which the substrate is positioned at the first position; and the lifter to place the substrate on the substrate support inward of the edge ring from the first position in a state in which the plasma is generated inside the chamber.

In an exemplary embodiment, the plasma processing apparatus further includes a loading device configured to load the substrate into the chamber. The controller is configured to further execute a control to cause the loading device to load the substrate to a second position spaced apart by a second distance from the substrate support inside the chamber. The first position is equal in distance from the substrate support as the second position or is spaced farther apart from the substrate support than the second position.

In an exemplary embodiment, the first distance is 1.3 mm or more and 3 mm or less.

In an exemplary embodiment, the plasma processing apparatus further includes a loading device configured to load the substrate into the chamber. The controller is configured to further execute a control to cause the loading device to load the substrate to a position spaced apart by a second distance from the substrate support inside the chamber. The first distance is 6.8% or more and 16% or less of the second distance.

In an exemplary embodiment, the plasma processing apparatus further includes an electrode provided at a third distance from the substrate support inside the chamber. The controller is configured to execute a control to supply a radio-frequency (RF) signal to the substrate support or the electrode to generate the plasma. The first distance is 6.8% or more and 16% or less of the third distance.

In an exemplary embodiment, the substrate support includes an electrostatic attractor configured to electrostatically attract the substrate. The controller is configured to further execute a control to cause the electrostatic attractor to electrostatically attract the substrate placed on the substrate support to the substrate support.

In an exemplary embodiment, the controller is configured to execute a control such that an internal pressure of the chamber is 250 mTorr or less.

In an exemplary embodiment, the plasma generator is configured to generate the plasma inside the chamber with the RF power. The controller is configured to further execute a control such that the RF power is 50 W or more and 1,000 W or less.

In an exemplary embodiment, the plasma processing apparatus further includes a gas supplier configured to supply a gas for generating the plasma into the chamber. The controller is configured to control a flow rate of the gas supplied into the chamber by the gas supplier based on the distance between the substrate support and the substrate.

In an exemplary embodiment, the controller is configured to control the gas supplier such that the flow rate of the gas is a first flow rate when the substrate is positioned at the first position, and to control the gas supplier such that the flow rate of the gas is greater than the first flow rate when the substrate is positioned at a position closer to the substrate support than the first position.

In an exemplary embodiment, the substrate has a first surface and a second surface opposite to the first surface. The second surface is a surface on which the substrate support supports the substrate. The first distance is a distance where a potential of the first surface and a potential of the second surface become equal to each other in a state in which the plasma is generated.

An exemplary embodiment provides a plasma processing apparatus that performs plasma processing on a substrate. The plasma processing apparatus includes: a chamber; a substrate support provided inside the chamber and configured to support the substrate; a plasma generator provided inside the chamber to generate plasma; a lifter provided inside the chamber and configured to control a distance between the substrate support and the substrate; and a controller. The controller is configured to execute a control to cause: the lifter to move the substrate from a position spaced apart from the substrate support toward the substrate support; the plasma generator to generate the plasma inside the chamber while the substrate is being moved; and the lifter to place the substrate on the substrate support in a state in which the plasma is generated inside the chamber.

An exemplary embodiment provides a plasma processing method of performing plasma processing on a substrate in a plasma processing apparatus. The plasma processing apparatus includes: a chamber; a substrate support provided inside the chamber, which includes a region in which the substrate is supported and an edge ring provided around the region, and is configured to support the substrate inward of the edge ring; a plasma generator configured to generate plasma inside the chamber; and a lifter provided inside the chamber to control the distance between the substrate support and the substrate. The plasma processing method includes: positioning, by the lifter, the substrate at a first position spaced apart by a first distance from the substrate support; generating, by the plasma generator, the plasma inside the chamber in a state in which the substrate is positioned at the first position; and placing, by the lifter, the substrate on the substrate support inward of the edge ring from the first position in a state in which the plasma is generated inside the chamber.

Hereinafter, each embodiment of the present disclosure will be described in detail with reference to the drawings. In each drawing, the same or similar elements will be denoted by the same reference numerals, and redundant descriptions thereof will be omitted. Unless otherwise specified, positional relationships, such as up, down, left, and right, will be described based on positional relationships illustrated in the drawings. Dimensional ratios in the drawings do not coincide with actual dimension ratios. The actual dimensional ratios are not limited to those illustrated in the drawings.

<Configuration of Plasma Processing System>

Figure 1:
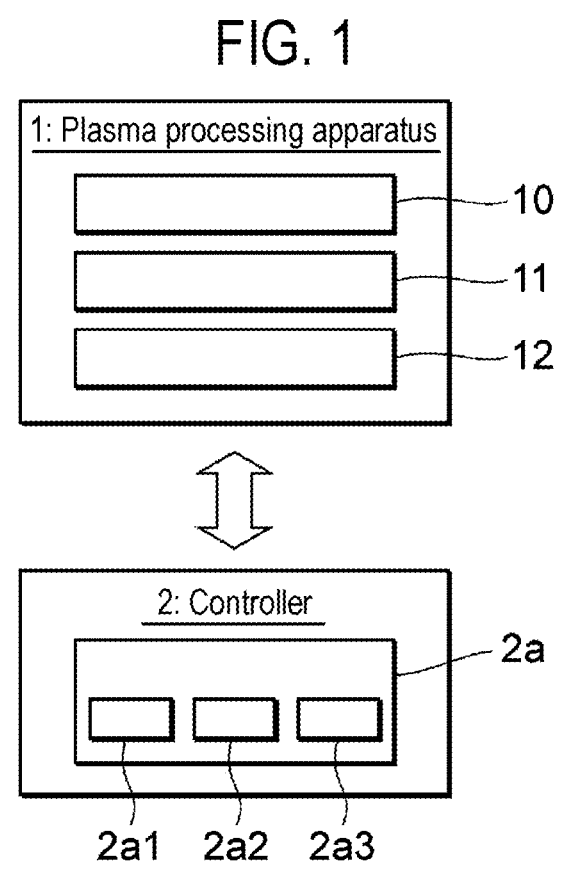

FIG. 1 is a view illustrating a configuration example of a plasma processing system. In an embodiment, the plasma processing system includes a plasma processing apparatus 1 and a controller 2. The plasma processing system is an example of a substrate processing system, and the plasma processing apparatus 1 is an example of a substrate processing apparatus. The plasma processing apparatus 1 includes a plasma processing chamber 10, a substrate support 11, and a plasma generator 12. The plasma processing chamber 10 has a plasma processing space. In addition, the plasma processing chamber 10 includes at least one gas supply port configured to supply at least one processing gas to the plasma processing space, and at least one gas discharge port configured to discharge gas from the plasma processing space. The gas supply port is connected to a gas supplier 20 to be described later, and the gas discharge port is connected to an exhaust system 40 to be described later. The substrate support 11 is arranged inside the plasma processing space and has a substrate support surface on which a substrate is supported.

The plasma generator 12 is configured to generate plasma from the at least one processing gas supplied into the plasma processing space. The plasma formed in the plasma processing space may be capacitively coupled plasma (CCP), inductively coupled plasma (ICP), electron-cyclotron-resonance (ECR) plasma, helicon wave plasma (HWP), surface wave plasma (SWP), or the like. In addition, various types of plasma generators including an alternating current (AC) plasma generator and a direct current (DC) plasma generator may be used. In an embodiment, an AC signal (AC power) used in the AC plasma generator has a frequency in a range of 100 kHz to 10 GHz. Therefore, the AC signal includes a radio-frequency (RF) signal and a microwave signal. In an embodiment, the RF signal has a frequency in a range of 100 kHz to 150 MHz.

The controller 2 processes computer-executable commands that cause the plasma processing apparatus 1 to execute various operations described herein. The controller 2 may be configured to control each element of the plasma processing apparatus 1 so as to perform various operations described herein. In an embodiment, some elements or all of the controller 2 may be included in the plasma processing apparatus 1. The controller 2 may include a processor 2*a*1, a storage 2*a*2, and a communication interface 2*a*3. The controller 2 is implemented by, for example, a computer 2*a*. The processor 2*a*1 may be configured to perform various control operations by reading a program from the storage 2*a*2 and executing the read program. This program may be stored in the storage 2*a*2 in advance, or may be acquired via a medium when necessary. The acquired program is stored in the storage 2*a*2, and read from the storage 2*a*2 and executed by the processor 2*a*1. The medium may be various storage media readable by the computer 2*a*, or may be a communication line connected to the communication interface 2*a*3. The processor 2*a*1 may be a central processing unit (CPU). The storage 2*a*2 may include a random access memory (RAM), a read only memory (ROM), a hard disk drive (HDD), a solid state drive (SSD), or a combination thereof. The communication interface 2*a*3 may communicate with the plasma processing apparatus 1 via a communication line such as a local area network (LAN).

<Configuration of Plasma Processing Apparatus>

A configuration example of a capacitively coupled plasma processing apparatus as an example of the plasma processing apparatus 1 will be described below. FIG. 2 is a view illustrating the configuration example of the capacitively coupled plasma processing apparatus.

The capacitively coupled plasma processing apparatus 1 includes a plasma processing chamber 10, a gas supplier 20, a power supply 30, and an exhaust system 40. In addition, the plasma processing apparatus 1 includes a substrate support 11 and a gas introducer. The gas introducer is configured to introduce at least one processing gas into the plasma processing chamber 10. The gas introducer includes a shower head 13. The substrate support 11 is arranged inside the plasma processing chamber 10. The shower head 13 is arranged above the substrate support 11. In an embodiment, the shower head 13 constitutes at least a portion of a ceiling of the plasma processing chamber 10. The plasma processing chamber 10 has a plasma processing space 10*s* defined by the shower head 13, a sidewall 10*a* of the plasma processing chamber 10, and the substrate support 11. The plasma processing chamber 10 is grounded. The shower head 13 and the substrate support 11 are electrically insulated from a housing of the plasma processing chamber 10.

The substrate support 11 includes a main body 111 and a ring assembly 112. The main body 111 has a central region 111*a* in which a substrate W is supported and an annular region 111*b* in which the ring assembly 112 is supported. A wafer is an example of the substrate W. The annular region 111*b* of the main body 111 surrounds the central region 111*a* of the main body 111 in a plan view. The substrate W is placed on the central region 111*a* of the main body 111, and the ring assembly 112 is disposed on the annular region 111*b* of the main body 111 to surround the substrate W on the central region 111*a* of the main body 111. Accordingly, the central region 111*a* is also referred to as a "substrate support surface" in which the substrate W is supported, and the annular region 111*b* is also referred to as a "ring support surface" in which the ring assembly 112 is supported.

In an embodiment, the main body 111 includes a base 1110 and an electrostatic chuck 1111. The base 1110 includes a conductive member. The conductive member of the base 1110 may function as a lower electrode. The electrostatic chuck 1111 is disposed on the base 1110. The electrostatic chuck 1111 includes a ceramic member 1111*a* and an electrostatic electrode 1111*b* disposed inside the ceramic member ber 1111*a*. The ceramic member 1111*a* has a central region 111*a*. In an embodiment, the ceramic member 1111*a* also has an annular region 111*b*. In addition, another member surrounding the electrostatic chuck 1111, such as an annular electrostatic chuck or an annular insulating member, may have the annular region 111*b*. In this case, the ring assembly 112 may be placed on the annular electrostatic chuck or the annular insulating member, or may be placed on both the electrostatic chuck 1111 and the annular insulating member. In addition, at least one RF/DC electrode coupled to an RF power supply 31 and/or a DC power supply 32 to be described below, may be disposed within the ceramic member 1111*a*. In this case, the at least one RF/DC electrode functions as the lower electrode. When a bias RF signal and/or a DC signal to be described below is supplied to the at least one RF/DC electrode, the RF/DC electrode is also referred to as a "bias electrode". In addition, the conductive member of the base 1110 and the at least one RF/DC electrode may function as a plurality of lower electrodes. In addition, the electrostatic electrode 1111*b* may function as a lower electrode. Accordingly, the substrate support 11 includes at least one lower electrode.

The ring assembly 112 includes one or more annular members. In an embodiment, the one or more annular members include one or more edge rings and at least one cover ring. Each edge ring is made of a conductive material or an insulating material, and each cover ring is made of an insulating material.

In addition, the substrate support 11 may include a temperature adjusting module configured to adjust at least one of the electrostatic chuck 1111, the ring assembly 112, and the substrate to have a target temperature. The temperature adjusting module may include a heater, a heat transfer media, a flow path 1110*a*, or a combination thereof. A heat transfer fluid, such as brine or gas, flows through the flow path 1110*a*. In an embodiment, the flow path 1110*a* is formed inside the base 1110, and one or more heaters are disposed in the ceramic member 1111*a* of electrostatic chuck 1111. The substrate support 11 may also include a heat transfer gas supplier configured to supply the heat transfer gas to a gap between a rear surface of the substrate W and the central region 111*a*.

Further, a through-hole 50 is formed in the substrate support 11 and the bottom wall 10*b* of the plasma processing chamber 10 to pass through the substrate support 11 and the bottom wall 10*b*. A plurality of through-holes 50 may be formed in the substrate support 11 and the bottom wall 10*b*. In the present embodiment, three through-holes 50 are formed in the substrate support 11 and the bottom wall 10*b*. A lifter 60 is provided inside each of the through-holes 50. The lifter 60 is connected to an actuator 70, and is configured to be raised or lowered inside the through-hole 50 in the Z direction illustrated in FIG. 2 by the actuator 70. In addition, when the actuator 70 raises the lifters 60, tips of the lifters 60 protrude from the central region 111*a* of the substrate support 11. As a result, the lifters 60 may move the substrate by a predetermined distance from the substrate support 11 and hold the substrate at a predetermined position. On the other hand, when the actuator 70 lowers the lifters 60, the tips of the lifters 60 are accommodated in the substrate support 11. As a result, the substrate held at the tips of the lifters 60 may be placed on the central region 111*a* of the substrate support 11. In this way, the actuator 70 is capable of controlling the distance or position of the substrate relative to the central region 111*a* of the substrate support 11 by using the lifters 60.

The shower head 13 is configured to introduce at least one processing gas from the gas supplier 20 into the plasma processing space 10s. The shower head 13 includes at least one gas supply port 13a, at least one gas diffusion chamber 13b, and a plurality of gas introduction ports 13c. The processing gas supplied to the gas supply port 13a passes through the gas diffusion chamber 13b and is introduced into the plasma processing space 10s via the plurality of gas introduction ports 13c. In addition, the shower head 13 includes at least one upper electrode. In addition to the shower head 13, the gas introducer may include one or more side gas injectors (SGIs) installed in one or more openings formed in the sidewall 10a.

The gas supplier 20 may include at least one gas source 21 and at least one flow rate controller 22. In an embodiment, the gas supplier 20 is configured to supply at least one processing gas from a corresponding gas source 21 to the shower head 13 via a corresponding flow rate controller 22. Each flow rate controller 22 may include, for example, a mass flow rate controller or a pressure-controlled flow rate controller. The gas supplier 20 may include at least one flow rate modulation device configured to modulate or pulse the flow rate of the at least one processing gas.

The power supply 30 includes an RF power supply 31 coupled to the plasma processing chamber 10 via at least one impedance matching circuit. The RF power supply 31 is configured to supply at least one RF signal (RF power) to the at least one lower electrode and/or the at least one upper electrode. As a result, plasma is formed from at least one processing gas supplied to the plasma processing space 10s. Therefore, the RF power supply 31 may function as at least a portion of the plasma generator 12. In addition, by supplying a bias RF signal to the at least one lower electrode, a bias potential may be generated in the substrate W, which makes it possible to draw ionic components in the formed plasma into the substrate W.

In an embodiment, the RF power supply 31 includes a first RF generator 31a and a second RF generator 31b. The first RF generator 31a is coupled to the at least one lower electrode and/or the at least one upper electrode via at least one impedance matching circuit to generate a source RF signal (source RF power) for plasma generation. In an embodiment, the source RF signal has a frequency in a range of 10 MHz to 150 MHz. In an embodiment, the first RF generator 31a may be configured to generate a plurality of source RF signals having different frequencies. One or more generated source RF signals are provided to the at least one lower electrode and/or the at least one upper electrode.

The second RF generator 31b is coupled to the at least one lower electrode via the at least one impedance matching circuit and is configured to generate a bias RF signal (bias RF power). A frequency of the bias RF signal may be the same as or different from a frequency of the source RF signal. In an embodiment, the bias RF signal has a frequency lower than the frequency of the source RF signal. In an embodiment, the bias RF signal has a frequency in a range of 100 kHz to 60 MHz. In an embodiment, the second RF generator 31b may be configured to generate a plurality of bias RF signals having different frequencies. One or more generated bias RF signals are provided to the at least one lower electrode. In addition, in various embodiments, at least one of the source RF signal and the bias RF signal may be pulsed.

The power supply 30 may include a DC power supply 32 coupled to the plasma processing chamber 10. The DC power supply 32 includes a first DC generator 32a and a second DC generator 32b. In an embodiment, the first DC generator 32a is connected to the at least one lower electrode and is configured to generate a first DC signal. The generated first DC signal is applied to the at least one lower electrode. In an embodiment, the second DC generator 32b is connected to the at least one upper electrode and is configured to generate a second DC signal. The generated second DC signal is applied to the at least one upper electrode.

In various embodiments, the first and second DC signals may be pulsed. In this case, a sequence of voltage pulses is applied to the at least one lower electrode and/or the at least one upper electrode. The voltage pulses may have a rectangular pulse waveform, a trapezoidal pulse waveform, a triangular pulse waveform, or a combination thereof. In an embodiment, a waveform generator configured to generate the sequence of voltage pulses from the DC signal is connected between the first DC generator 32a and the at least one lower electrode. Therefore, the first DC generator 32a and the waveform generator constitute a voltage pulse generator. When the second DC generator 32b and the waveform generator constitute a voltage pulse generator, the voltage pulse generator is connected to at least one upper electrode. The voltage pulses may have either a positive polarity or a negative polarity. In addition, the sequence of voltage pulses may include one or more positive voltage pulses and one or more negative voltage pulses in one cycle. Further, the first and second DC generators 32a and 32b may be provided in addition to the RF power supply 31, or the first DC generator 32a may be provided in place of the second RF generator 31b.

The exhaust system 40 may be connected to, for example, a gas discharge port 10e provided at the bottom of the plasma processing chamber 10. The exhaust system 40 may include a pressure regulating valve and a vacuum pump. By the pressure regulating valve, the internal pressure of the plasma processing space 10s is regulated. The vacuum pump may include a turbo molecular pump, a dry pump, or a combination thereof.

<Configuration of Substrate Processing System PS>

Figure 3:
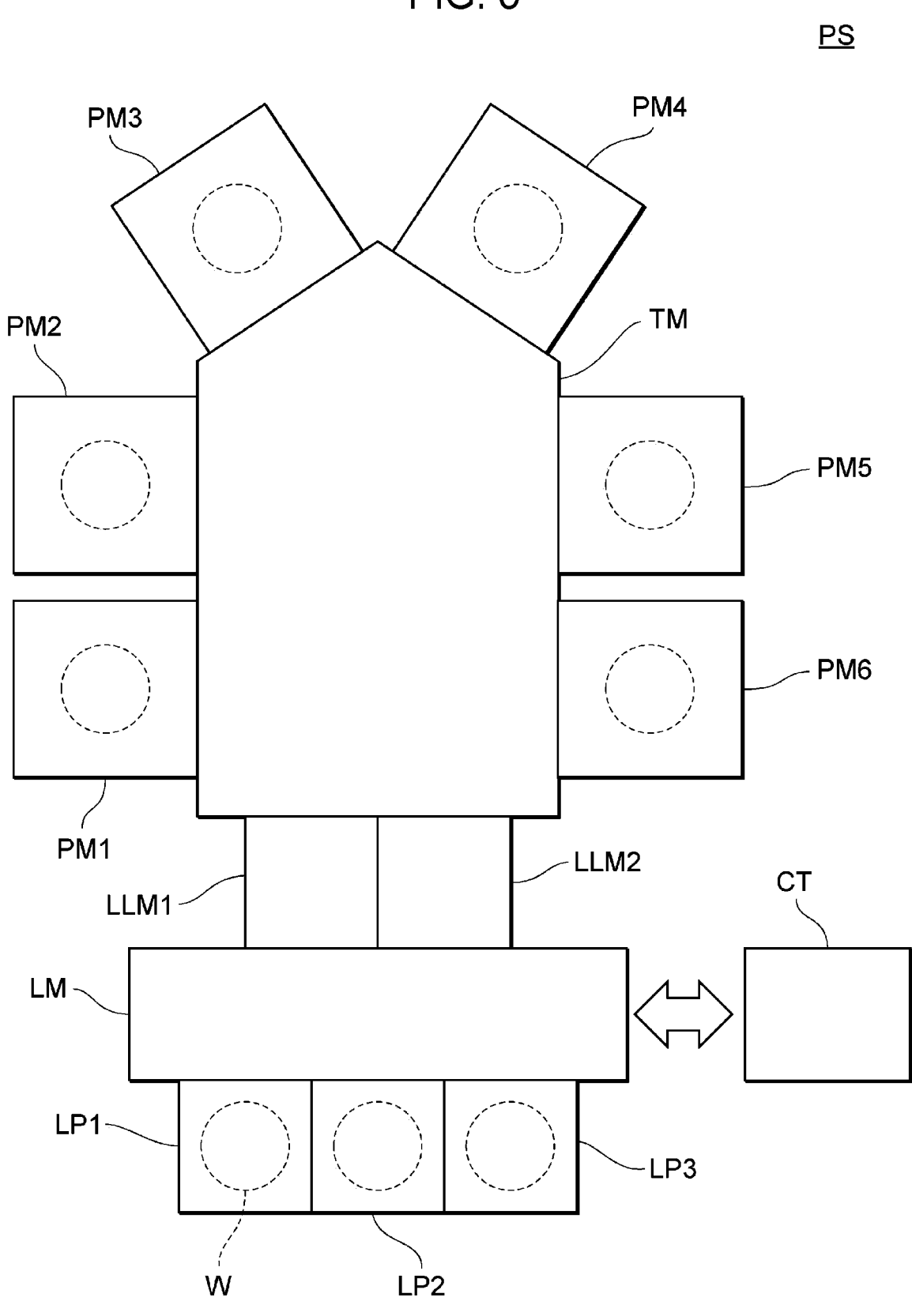
FIG. 3 is a view schematically illustrating a substrate processing system according to an embodiment.

FIG. 3 is a view schematically illustrating a substrate processing system PS according to an exemplary embodiment. The substrate processing system PS includes substrate processing modules PM1 to PM6 (hereinafter, also collectively referred to as "substrate processing modules PM"), a transfer module TM, load-lock modules LLM1 and LLM2 (hereinafter, also collectively referred to as "load-lock modules LLM"), a loader module LM, and load ports LP1 to LP3 (hereinafter, also collectively referred to as "load ports LP"). The controller CT controls each component of the substrate processing system PS to perform a predetermined process on the substrate W.

The substrate processing modules PM perform processes, such as etching, trimming, film formation, annealing, doping, lithography, cleaning, and ashing, respectively, on the substrate W in an interior of each substrate processing module PM. Some of the substrate processing modules PM may be measurement modules configured to measure a thickness of a layer formed on the substrate W, a dimension of a pattern formed on the substrate W, and the like. The plasma processing apparatus 1 illustrated in FIG. 1 is an example of the substrate processing module PM.

The transfer module TM includes a transfer device configured to transfer substrates W, and transfers the substrates W between the substrate processing modules PM or between the substrate processing modules PM and the load-lock modules LLM. The substrate processing modules PM and the load-lock modules LLM are arranged adjacent to the transfer module TM. The transfer module TM, the substrate processing modules PM, and the load-lock modules LLM are spatially isolated or connected by gate valves that may be opened and closed. An example of the gate valve is a gate valve 85 illustrated in FIG. 2. In the present embodiment, the transfer device included in the transfer module TM transfers the substrate W from the transfer module TM to the plasma processing space 10s of the plasma processing apparatus 1 (see FIG. 2), which is an example of the substrate processing modules PM. The transfer device moves the substrate W in the X direction indicated in FIG. 2 and positions the substrate W at a position facing the substrate support 11 between the substrate support 11 and the shower head 13. As an example, the transfer device may be a handler configured to transfer a substrate such as a silicon wafer.

The load-lock modules LLM1 and LLM2 are provided between the transfer module TM and the loader module LM. An internal pressure of each load-lock module LLM may be switched to an atmospheric pressure or a vacuum. Each load-lock module LLM transfers the substrate W from the loader module LM under the atmospheric pressure to the transfer module TM under the vacuum, and also transfers the substrate W from the transfer module TM under the vacuum to the loader module LM under the atmospheric pressure.

The loader module LM includes a transfer device that transfers the substrates W, and transfers the substrates W between the load-lock modules LLM and the load ports LP. A front opening unified pod (FOUP) capable of accommodating, for example, 25 substrates W or an empty FOUP may be placed inside each of the load ports LP. The loader module LM takes out the substrate W from the FOUP in each load port LP and transfer the same to the load-lock module LLM. In addition, the loader module LM takes out the substrate W from each load-lock module LLM and transfers the same to the FOUP in each load port LP. At least one of the plurality of load ports LP may have a FOUP that accommodates a dummy substrate.

The controller CT controls each component of the substrate processing system PS to perform a predetermined process on the substrate W. The controller CT stores a recipe in which process procedures, process conditions, transfer conditions, and the like are set, and controls each component of the substrate processing system PS to perform the predetermined process on the substrate W according to the recipe. The controller CT may also function as a portion or all of the controller 2 of the plasma processing apparatus 1 illustrated in FIG. 1.

<Plasma Processing Method>

Figure 4:
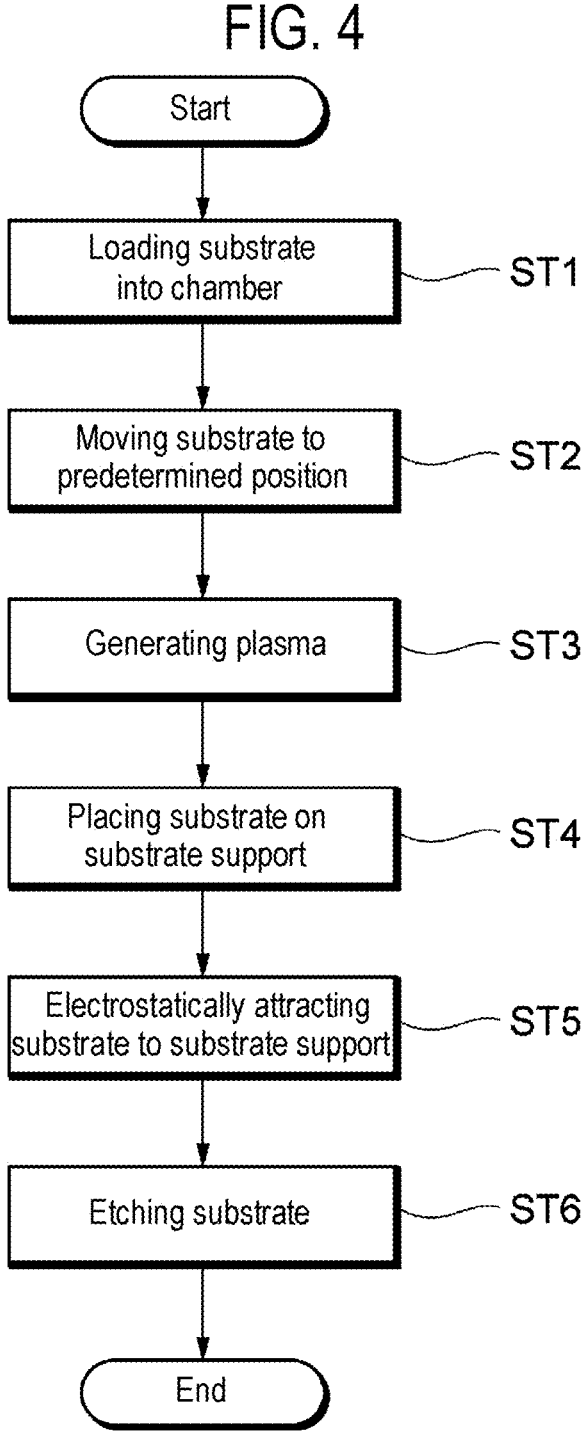
FIG. 4 is a flowchart illustrating a plasma processing method according to an embodiment.

FIG. 4 is a flowchart illustrating a plasma processing method according to an embodiment. The plasma processing method illustrated in FIG. 4 includes transferring the substrate W into the plasma processing chamber 10 (Operation ST1), moving the substrate W to a predetermined position (Operation ST2), generating plasma in the plasma processing chamber 10 (Operation ST3), placing the substrate W on the substrate support 11 (Operation ST4), electrostatically attracting the substrate W to the substrate support 11 (Operation ST5), and etching the substrate W (Operation ST6). The processing illustrated in each operation in FIG. 4 is implemented by operating the plasma processing apparatus 1 and/or the substrate processing system PS mainly under the control of the controller 2 and/or the controller CT.

FIGS. 5 to 9 are views schematically illustrating a portion of the interior of the plasma processing chamber 10 in each operation shown in FIG. 4. The plasma processing method illustrated in FIG. 4 will be described with reference to FIGS. 5 to 9.

Figure 5:
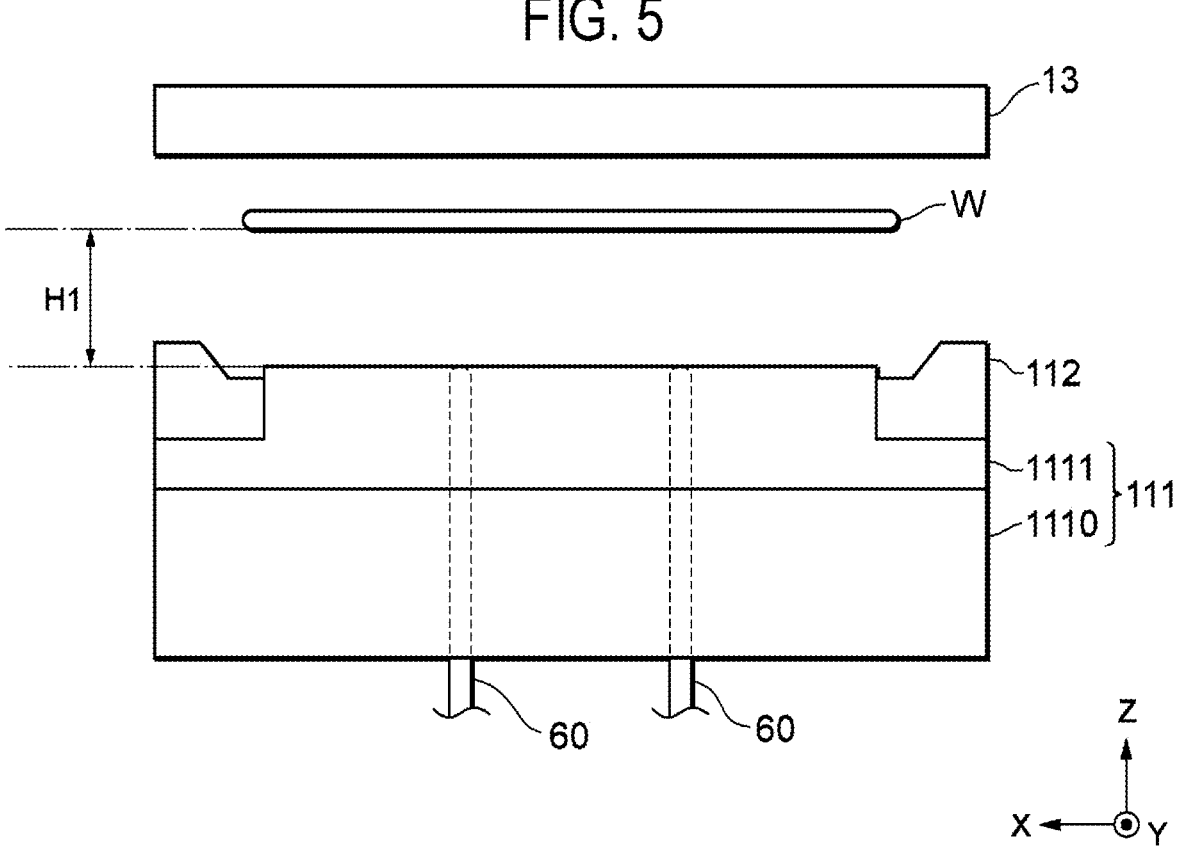
FIG. 5 is a view schematically illustrating a state of a portion of an interior of a plasma processing chamber in each operation shown in FIG. 4.

First, as illustrated in FIG. 5, in Operation ST1, the substrate W is transferred into the plasma processing chamber 10. The transfer device included in the transfer module TM illustrated in FIG. 3 transfers the substrate W into the plasma processing chamber 10. The transfer device horizontally moves the substrate W from the transfer module TM illustrated in FIG. 3 to the plasma processing space 10s in the X direction indicated in FIG. 2 via the gate valve 85 illustrated in FIG. 2, and loads the substrate W into the plasma processing chamber 10. Although the transfer device is not illustrated in FIG. 5, as an example, the transfer device may be a handler configured to support the substrate W on a rear surface of the substrate W, move the substrate W in the X direction indicated in FIG. 5, and hold the substrate W at a predetermined position in the X direction.

In the present embodiment, the transfer device holds the substrate W at the position where one surface of the substrate W faces the shower head 13 and the other surface thereof faces the substrate support 11 (hereinafter, the one surface is referred to as a "front surface", and the other surface is also referred to as a "rear surface". In addition, the front surface is an example of the first surface, and the rear surface is an example of the second surface). The position may be a position overlapping the shower head 13 and the substrate support 11 when viewed the substrate W in the Z direction. In addition, the transfer device loads the substrate W into the plasma processing chamber 10 such that the substrate W is parallel to the central region 111a of the substrate support 11. Further, the transfer device holds the substrate W at a height where a distance between the central region 111a of the substrate support 11 and the rear surface of the substrate W is H1 (hereinafter, this height is also referred to as "height H1").

Figure 6:
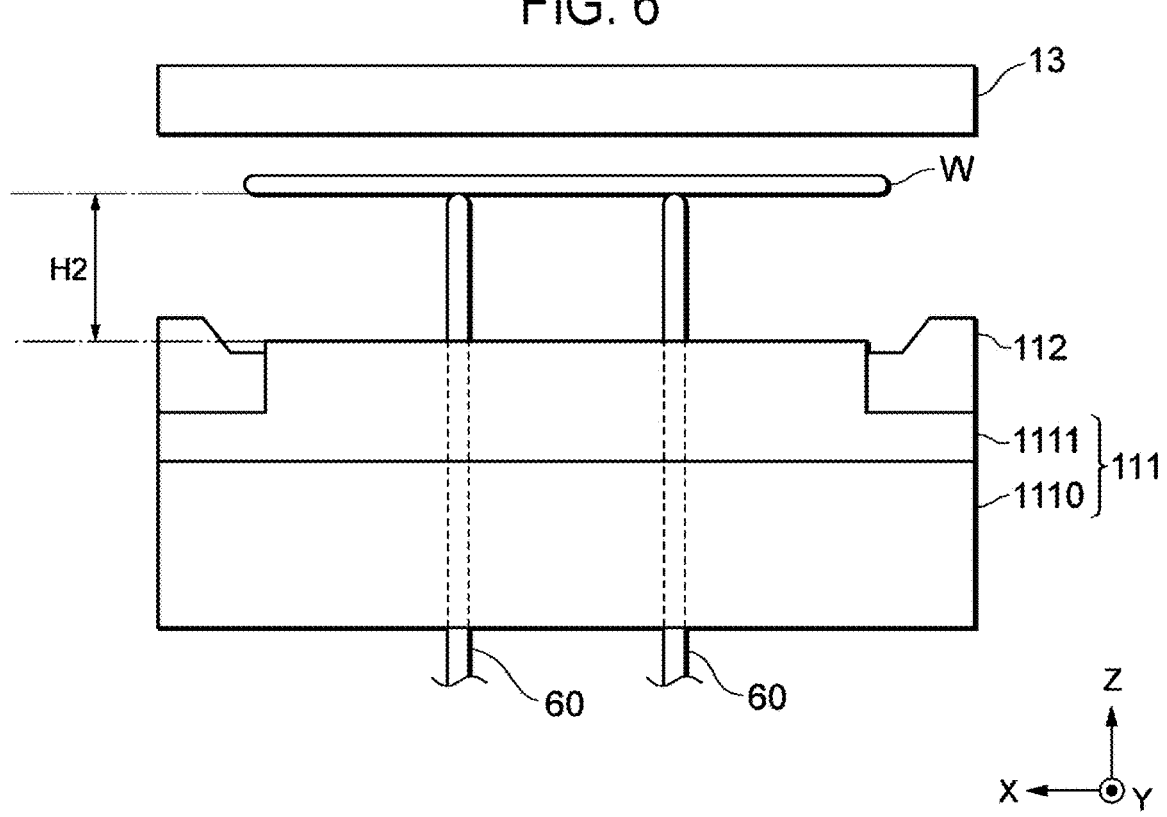
FIG. 6 is a view schematically illustrating a state of a portion of the interior of the plasma processing chamber in each operation shown in FIG. 4.
Figure 7:
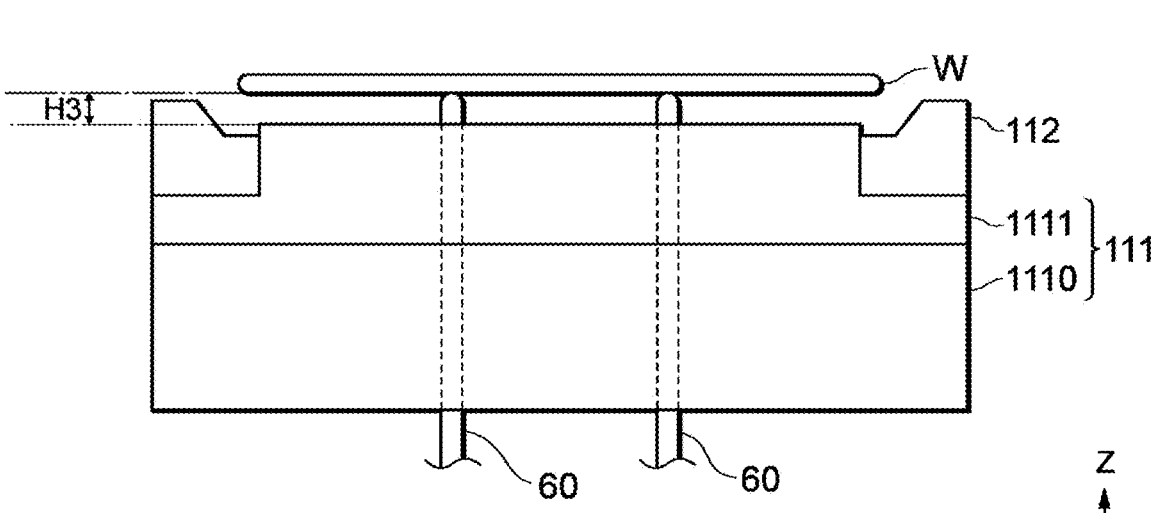
FIG. 7 is a view schematically illustrating a state of a portion of the interior of the plasma processing chamber in each operation shown in FIG. 4.

Subsequently, as illustrated in FIGS. 6 and 7, in Operation ST2, the substrate W is moved to a predetermined position by the lifters 60. First, as illustrated in FIG. 6, when the actuator 70 (see FIG. 2) raises the lifters 60, the lifters 60 hold, at the tips thereof, the substrate W held by the transfer device at the height H1 illustrated in FIG. 5. At this time, the lifters 60 may hold the substrate W at a height H2, which is a position spaced farther apart from the substrate support 11 than the height H1. As an example, after the lifters 60 lift the substrate W held at the height H1 by the transfer device to the height H2, the transfer device may move in the X direction and move from the plasma processing chamber 10 to the transfer module TM. The height H1 and the height H2 are examples of the second distance. In addition, a position where the substrate W faces the substrate support 11 at the height H1 or the height H2 is an example of the second position.

After holding the substrate W at the height H2, the lifters 60 move the substrate W to a height H3. The height H3 is an example of the first distance. In addition, a position where the substrate W faces the substrate support 11 at the height H3 is an example of the first position. In the present embodiment, the height H3 corresponds to a distance of 1.3 mm or more and 3 mm or less from the central region 111a of the substrate support 11. In addition, the height H3 may be 6.8% or more and 16% or less of the height H1 or the height H2. In addition, the height H3 may be 3.3% or more and 7.5% or less of the distance between the shower head 13 and the substrate support 11 in the Z direction. The distance between the shower head 13 and the substrate support 11 is an example of the third distance.

The height H3 may be a height where the substrate W and the ring assembly 112 are at the same potential in a state in which plasma P is generated in Operation ST3, which will be described later. In addition, the height H3 is a height where a potential difference occurring within the substrate W, for example, a potential difference occurring between the front surface and the rear surface of the substrate W, becomes the same potential when the plasma P is generated in Operation ST3 which will be described later. The same potential includes a potential difference in which an electrostatic breakdown is not occurred in an element formed on the substrate W. An example of the electrostatic breakdown in the element formed on the substrate W includes electrostatic breakdown of a gate insulating film of a MOS transistor formed on the substrate W.

Figure 8:
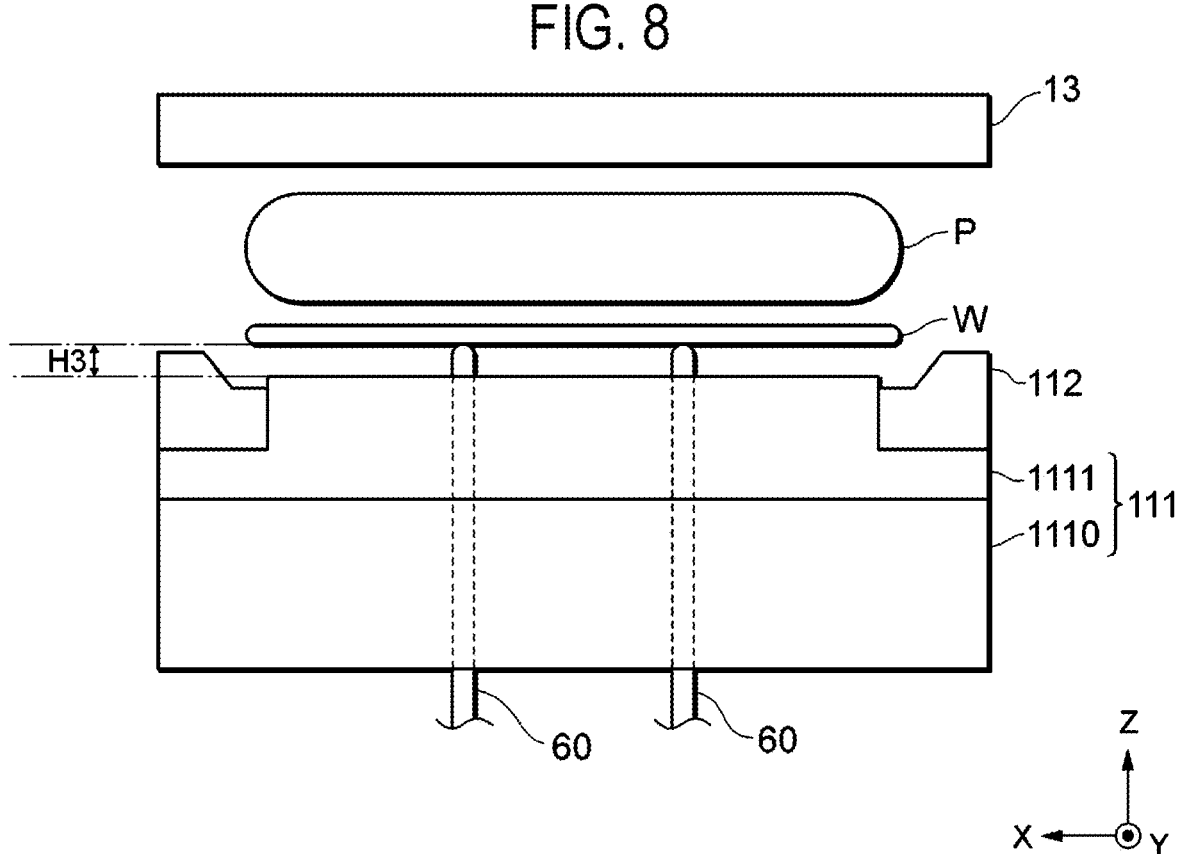
FIG. 8 is a view schematically illustrating a state of a portion of the interior of the plasma processing chamber in each operation shown in FIG. 4.

Subsequently, as illustrated in FIG. 8, the plasma P is generated in Operation ST3. In the present embodiment, the plasma P is generated between the front surface of the substrate W and the shower head 13 in the state in which the substrate W is at the height H3 from the substrate support 11. The plasma P may be generated by, for example, the following. That is, first, the gas supplier 20 supplies a gas for generating the plasma P into the plasma processing chamber 10. The gas may be, for example, an inert gas, such as argon (Ar), or may be a reactive gas for etching the substrate W. Further, the exhaust system 40 controls the internal pressure of the plasma processing chamber 10. The internal pressure is, for example, 250 mTorr or less. In addition, the internal pressure may be 200 mTorr or less, 150 mTorr or less, or 100 mTorr or less. In addition, the internal pressure may be equal to or close to the internal pressure of the plasma processing chamber 10 in Operation ST6 (etching), which will be described later. Then, the first RF generator 31a supplies the RF power to the substrate support 11 or the shower head 13 to generate the plasma P within the plasma processing chamber 10. The RF power is, for example, 50 W or more and 1,000 W or less. In Operation ST3, the gas supplier 20 may set the flow rate of the gas supplied into the plasma processing chamber 10 to a constant flow rate. In addition, the gas supplier 20 may supply the gas for generating the plasma P into the plasma processing chamber 10 in both Operation ST2 and Operation ST3. The gas supplier 20 may supply the gas into the plasma processing chamber 10 at a constant flow rate or at different flow rates in Operation ST2 and Operation ST3.

In other embodiments, the plasma P may be generated while the lifters 60 are moving the substrate W. That is, the plasma P may be generated while the lifters 60 are moving the substrate W toward the substrate support 11 from the height H1 or H2. In this case, the plasma P may be generated when the height of the substrate W becomes 1.3 mm or more and 3 mm or less while the substrate W is moving toward the substrate support 11. In addition, in Operation ST2 and/or Operation ST3, the gas supplier 20 may control the flow rate of the gas to be supplied into the plasma processing chamber 10 according to the height of the substrate W. For example, when the substrate W is at a height closer to the substrate support 11 than at the height H3 than when the substrate W is at the height H3, the gas supplier 20 may increase the flow rate of the gas to be supplied into the plasma processing chamber 10. The gas supplier 20 may increase or decrease the flow rate of the gas to be supplied into the plasma processing chamber 10 in a continuous or stepwise manner according to the height of the substrate W.

Figure 9:
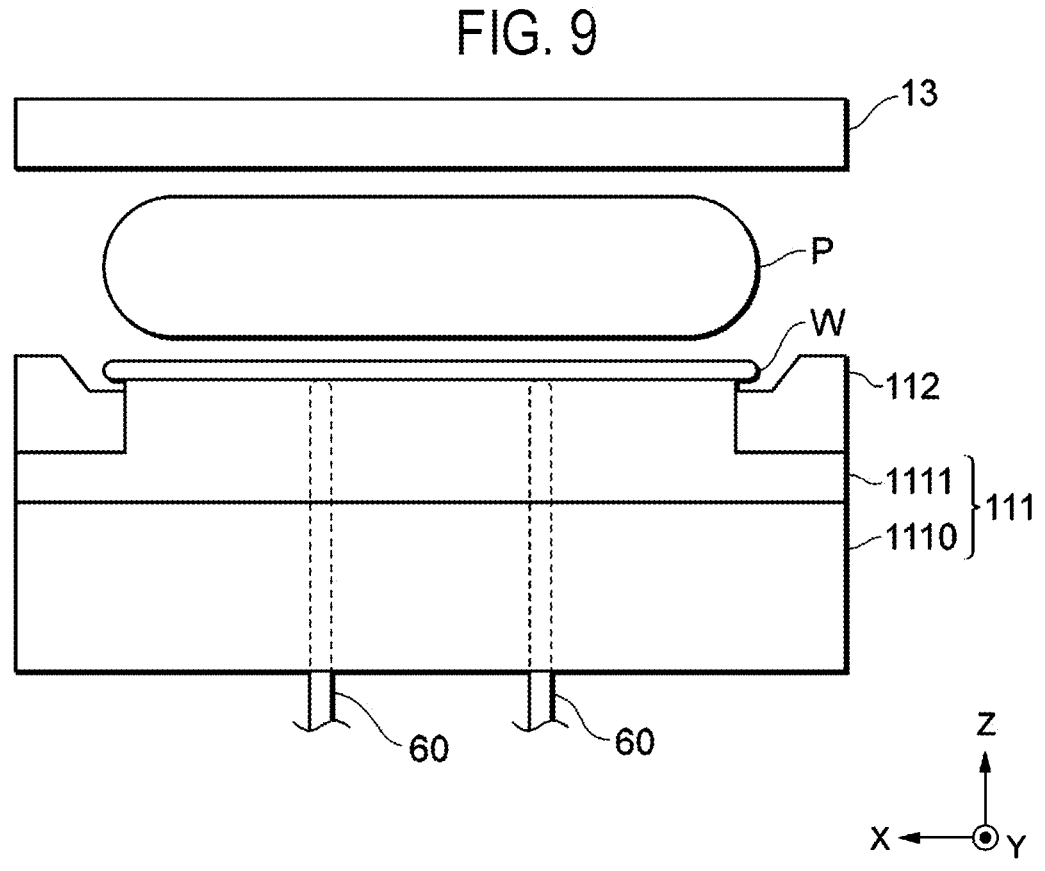
FIG. 9 is a view schematically illustrating a state of a portion of the interior of the plasma processing chamber in each operation shown in FIG. 4.

Subsequently, as illustrated in FIG. 9, in Operation ST4, the substrate W is placed on the substrate support 11. In the present embodiment, the substrate W is placed on the substrate support 11 inside the ring assembly 112 by the lifters 60 in the state in which the plasma P is generated between the substrate W and the shower head 13. Then, in Operation ST5, a voltage is applied to the electrostatic electrode 1111b (see FIG. 2) included in the electrostatic chuck 1111 so that the substrate W is electrostatically attracted to the substrate support 11. As a result, it is possible to reduce a load applied to the substrate W held by the lifters 60 due to the attraction potential.

Subsequently, after the substrate W is placed on the substrate support 11, the etching is performed on the substrate W in Operation ST6.

Figure 10:
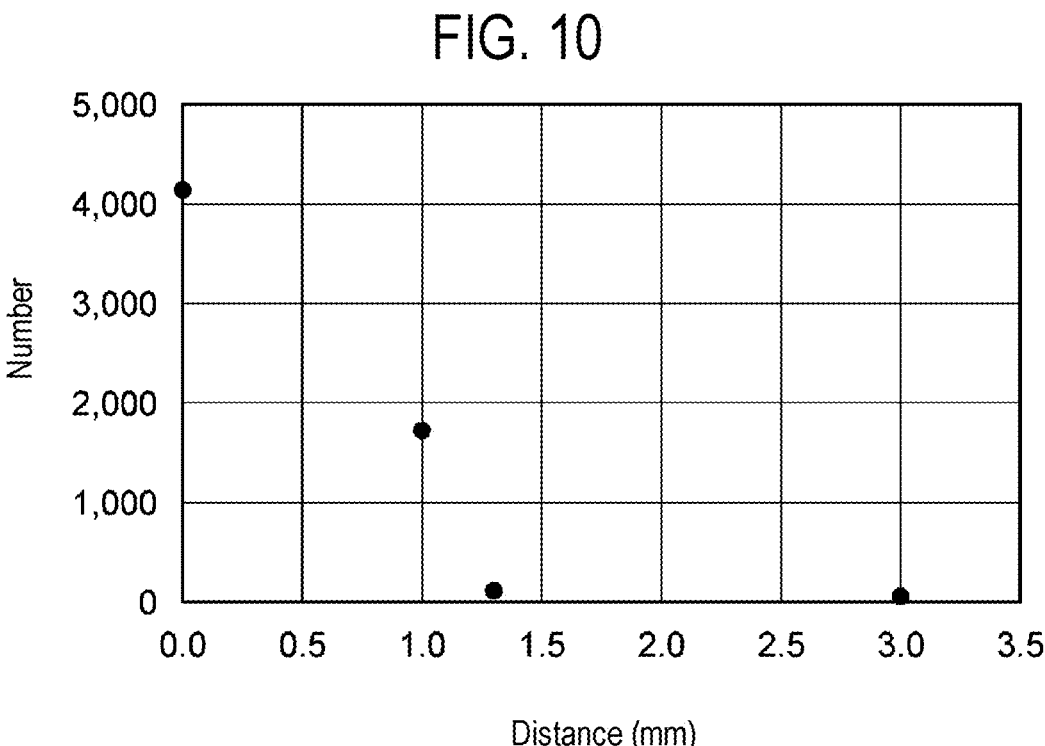
FIG. 10 is a graph showing a relationship between a distance between a substrate and a substrate support and the number of particles adhering to the substrate

FIG. 10 is a graph showing a relationship between the distance between the substrate W and the substrate support 11 and the number of particles adhering to the substrate W after the plasma generation in Operation ST3. The distance corresponds to the height H3 in FIG. 8. In the present example, in Operation ST3, the Ar gas was supplied to the plasma processing chamber 10 at the flow rate of 600 sccm, the internal pressure of the plasma processing chamber 10 was set to 100 mTorr, and the RF power of 100 W was supplied to the substrate support 11. As shown in FIG. 10, it was confirmed that, when the plasma was generated when the height H3 was 0.0 mm, that is, while the substrate W was placed on the substrate support 11, a large number of particles were observed on the substrate W. On the other hand, it was confirmed that, when the height H3 is increased, the number of particles was decreased. In addition, it was confirmed that, when the height H3 was 1.3 mm or more, the number of particles was decreased by 95% or more compared to that in the case where the height H3 was 0.0 mm.

According to the present embodiment, by generating the plasma in a state in which the distance between the substrate W and the substrate support 11 is greater than the predetermined distance, the plasma is generated within the plasma processing chamber 10 in a state in which the substrate W is spaced apart from the substrate support 11 and a structure provided around the substrate support 11. As a result, since the potential difference between the substrate W and the structure provided around the substrate support 11 is reduced, when the substrate W is placed on the substrate support 11, based on the potential difference, it is possible to suppress particles from adhering to the substrate W from the structure provided around the substrate support 11. The structure provided around the substrate support 11 is, for example, the ring assembly 112. In addition, according to the present embodiment, the particles receive a repulsive force from the substrate W due to an electrostatic repulsive force caused by an electric field in a sheath formed between substrate W and the plasma P. This suppresses particles from being accumulated on the substrate W.

Figure 11:
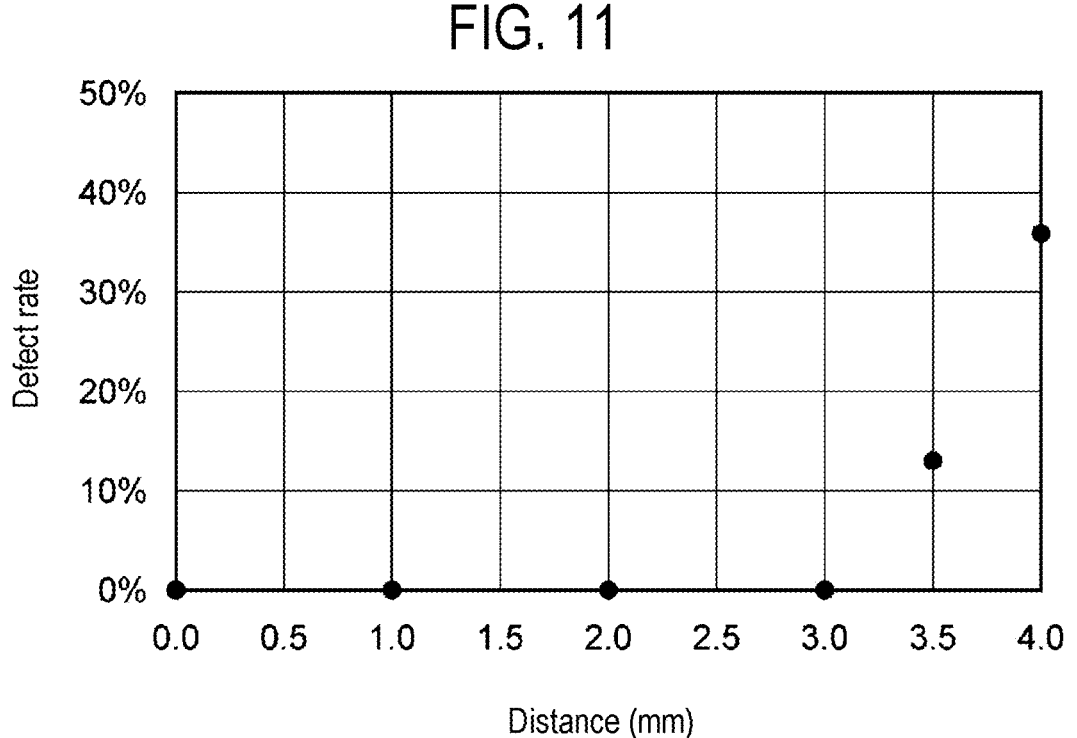
FIG. 11 is a graph showing a relationship between the distance between the substrate and the substrate support and a defect rate generated in elements formed on the substrate.

FIG. 11 is a graph showing a relationship between the distance between the substrate W and the substrate support 11 and a defect rate generated in the elements formed on the substrate W after the plasma generation in Operation ST3. The distance corresponds to the height H3 in FIG. 8. In the present example, in Operation ST3, the Ar gas was supplied to the plasma processing chamber 10 at the flow rate of 600 sccm, the internal pressure of the plasma processing chamber 10 was set to 100 mTorr, and the RF power of 100 W was supplied to the substrate support 11. As shown in FIG. 11, it was confirmed that the defect rate was 0% when the height H3 was 0.0 mm or more and 3.0 mm or less, whereas the defect rate was increased when the height H3 was 3.5 mm or more.

According to the present embodiment, by generating the plasma in the state in which the distance between the substrate W and the substrate support 11 is less than or equal to a predetermined distance, the potential difference generated within the substrate W due to the plasma, for example, the potential difference between the front surface and the rear surface of the substrate W decreases. This makes it possible to reduce a charge-up damage that occurs in the elements formed on the substrate W due to the plasma generation.

According to an exemplary embodiment of the present disclosure, a plasma processing apparatus capable of reducing particles adhering to a substrate may be provided.

It should be noted that the embodiments disclosed herein are exemplary in all respects and are not restrictive. The above-described embodiments may be omitted, replaced or modified in various forms without departing from the scope and spirit of the appended claims.

What is claimed is:

1. A plasma processing apparatus for performing plasma processing on a substrate, comprising:

a chamber;

a substrate support provided inside the chamber and including a region in which the substrate is supported and an edge ring provided around the region, the substrate support being configured to support the substrate inside the edge ring;

a plasma generator provided inside the chamber and configured to generate plasma;

a lifter provided inside the chamber and configured to control a distance between the substrate support and the substrate; and control circuitry configured to execute a control to cause:

the lifter to position the substrate at a first position spaced apart by a first distance from the substrate support;

the plasma generator to generate the plasma inside the chamber in a state in which the substrate is at the first position; and the lifter to place the substrate on the substrate support inward of the edge ring from the first position in a state in which the plasma is generated inside the chamber, wherein the first distance is 1.3 mm or more and 3 mm or less from a central region of the substrate support, the plasma process apparatus further includes a loading device configured to load the substrate into the chamber, the control circuitry is configured to further execute a control to cause the loading device to load the substrate, prior to causing the lifter to position the substrate in the first position, to a second position spaced apart by a second distance from the substrate support inside the chamber, and the first distance is 6.8% or more and 16% or less of the second distance.

2. The plasma processing apparatus of claim 1, further comprising:

a gas supplier configured to supply a gas for generating the plasma into the chamber, wherein the control circuitry is configured to control a flow rate of the gas supplied into the chamber by the gas supplier based on the distance between the substrate support and the substrate.

3. The plasma processing apparatus of claim 2, wherein the control circuitry is configured to:

control the gas supplier such that the flow rate of the gas is a first flow rate when the substrate is at the first position, and control the gas supplier such that the flow rate of the gas is greater than or equal to the first flow rate when the substrate is at a position closer to the substrate support than the first position.

4. The plasma processing apparatus of claim 1, further comprising:

an electrode provided at a third distance from the substrate support inside the chamber, wherein the control circuitry is configured to execute a control to supply radio-frequency power to the substrate support or the electrode so as to generate the plasma, and wherein the first distance is 3.3% or more and 7.5% or less of the third distance.

5. The plasma processing apparatus of claim 1, wherein the substrate support includes an electrostatic attractor configured to electrostatically attract the substrate, and wherein the control circuitry is configured to further execute a control to cause the electrostatic attractor to electrostatically attract the substrate placed on the substrate support to the substrate support.

6. The plasma processing apparatus of claim 1, wherein the control circuitry is configured to execute a control such that an internal pressure of the chamber is 250 mTorr or less.

7. The plasma processing apparatus of claim 1, wherein the plasma generator is configured to generate the plasma inside the chamber with the radio-frequency power, and wherein the control circuitry is configured to further execute a control such that the radio-frequency power is 50 W or more and 1,000 W or less.

8. A plasma processing apparatus for performing plasma processing on a substrate, comprising:

a chamber;

a substrate support provided inside the chamber, including an edge ring and configured to support the substrate;

a plasma generator provided inside the chamber and configured to generate plasma;

a lifter provided inside the chamber and configured to control a distance between the substrate support and the substrate; and control circuitry configured to execute a control to cause:

the lifter to position the substrate at a first position spaced apart by a first distance from the substrate support;

the plasma generator to generate the plasma inside the chamber in a state in which the substrate is at the first position; and the lifter to place the substrate on the substrate support inward of the edge ring from the first position in a state in which the plasma is generated inside the chamber, wherein the first distance is 1.3 mm or more and 3 mm or less from a central region of the substrate support, the plasma process apparatus further includes a loading device configured to load the substrate into the chamber, the control circuitry is configured to further execute a control to cause the loading device to load the substrate, prior to causing the lifter to position the substrate in the first position, to a second position spaced apart by a second distance from the substrate support inside the chamber and the first distance is 6.8% or more and 16% or less of the second distance.

9. A plasma processing method of performing plasma processing on a substrate in a plasma processing apparatus, wherein the plasma processing apparatus includes:

a chamber;

a substrate support provided inside the chamber and including a region in which the substrate is supported and an edge ring provided around the region, the substrate support being configured to support the substrate inside the edge ring;

a plasma generator provided inside the chamber and configured to generate the plasma; and a lifter provided inside the chamber and configured to control a distance between the substrate support and the substrate, the plasma processing method comprising:

positioning, by the lifter, the substrate at a first position spaced apart by a first distance from the substrate support, the first distance is 1.3 mm or more and 3 mm or less from a central region of the substrate support;

generating, by the plasma generator, the plasma inside the chamber in a state in which the substrate is positioned at the first position;

placing, by the lifter, the substrate on the substrate support inward of the edge ring from the first position in a state in which the plasma is generated inside the chamber; and causing a loading device to load the substrate, prior to causing the lifter to position the substrate in the first position, to a second position spaced apart by a second distance from the substrate support inside the chamber, wherein the first distance is 6.8% or more and 16% or less of the second distance.

*   *   *   *   *